United States Patent
Lauter et al.

(10) Patent No.: US 6,597,025 B2
(45) Date of Patent: Jul. 22, 2003

(54) LIGHT SENSITIVE SEMICONDUCTOR COMPONENT

(75) Inventors: Josef Lauter, Geilenkirchen (DE); Armin Kemna, Duisburg (DE); Werner Brockherde, Duisburg (DE); Ralf Hausschild, Solingen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/095,832

(22) Filed: Mar. 12, 2002

(65) Prior Publication Data

US 2002/0140045 A1 Oct. 3, 2002

(30) Foreign Application Priority Data

Mar. 15, 2001 (DE) .......................... 101 12 374

(51) Int. Cl.[7] .................... H01L 29/80; H01L 31/112
(52) U.S. Cl. .................... 257/258; 257/257; 257/465
(58) Field of Search ................. 257/257, 258, 257/461, 465

(56) References Cited

U.S. PATENT DOCUMENTS

| | | | | |
|---|---|---|---|---|
| 3,668,473 A | * | 6/1972 | Miyashiro | ............... 257/461 |
| 4,458,260 A | * | 7/1984 | McIntyre et al. | ............ 257/438 |
| 6,034,321 A | * | 3/2000 | Jenkins | ........................ 136/252 |
| 6,047,042 A | * | 4/2000 | Khutoryansky et al. | ...... 378/62 |
| 6,198,118 B1 | * | 3/2001 | Holcombe | ................... 257/292 |

FOREIGN PATENT DOCUMENTS

EP    0883187    12/1998    ......... H01L/27/146

* cited by examiner

Primary Examiner—Allan R. Wilson
(74) Attorney, Agent, or Firm—John Vodopia

(57) ABSTRACT

The invention relates to a light-sensitive semiconductor component that consists of pixels (1), wherein n doped dot zones (7) are provided, in a preferably hexagonal pattern, on the surface of a p doped channel region, the dot zones (7) of a pixel (1) being electrically connected to one another by means of leads (6) and to a collecting lead (4). The dot zones (7) form parallel connected semiconductor diodes whereby minority charge carriers that are generated by the incidence of light in the channel region can be detected after having traveled to the dot zones (7) by diffusion. The described arrangement enables a high sensitivity to be achieved throughout the channel region and also a minimum capacitance of the semiconductor constructed by means of the CMOS technique. Diffusion of charge carriers out of a pixel is prevented by a guard ring (3) of an opposed type of doping.

17 Claims, 1 Drawing Sheet

LIGHT SENSITIVE SEMICONDUCTOR COMPONENT

Figure 1:
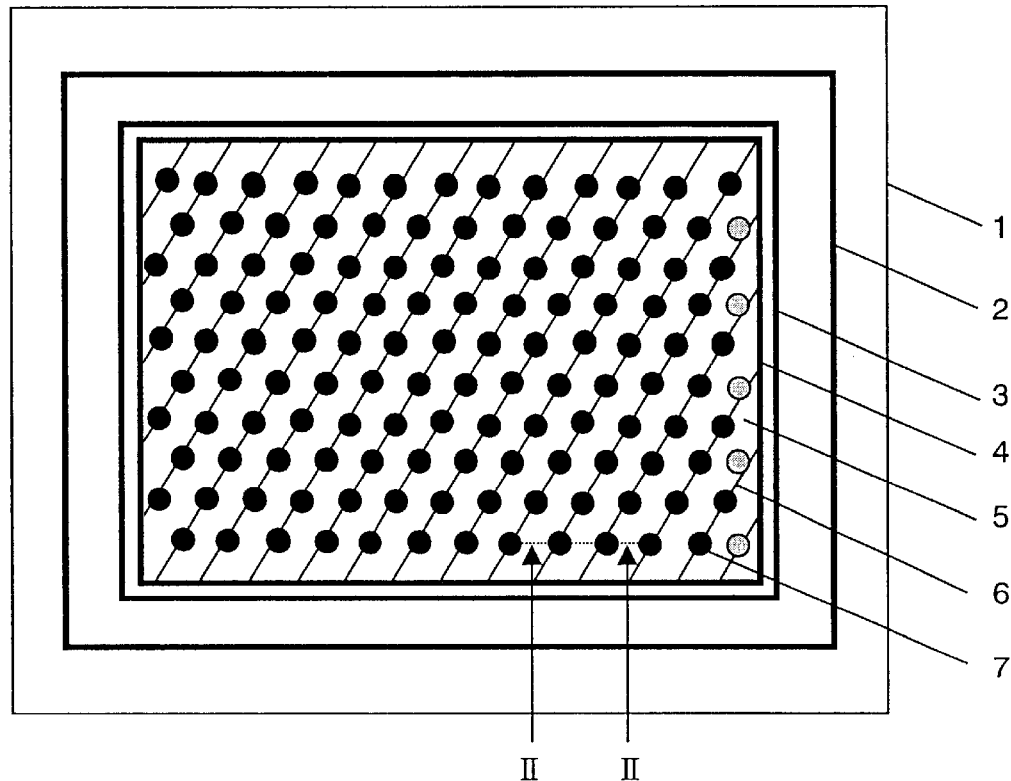

The invention relates to a light-sensitive semiconductor component that includes a channel region with a first type of doping and zones with an opposed type of doping that are in contact therewith, a pn junction being formed at the area of contact between the channel region and the zones.

A semiconductor component of the kind set forth is known from EP 0 883 187 A1. The component is constructed in principle as a semiconductor diode in CMOS technology. On a p doped substrate therein there is provided a p- (that is, weaker) doped channel region in which a "dot-shaped", or slightly laterally expanded, n doped zone is inserted by diffusion or preferably by implantation. This n doped zone will be referred to hereinafter as a "dot zone" because of its shape relative to the channel region. A pn junction is formed in known manner between the n doped dot zone and the p doped channel region.

The known semiconductor diode is connected so as to detect light quanta. A light quantum that is incident in the laterally extending channel region generates a pair of charge carriers therein, that is, a hole and a free electron. The charge carriers exist until they are "destroyed" again by recombination. When the doping of the channel region is weak enough, however, they will have a long life during which notably the minority charge carriers (for example, an electron in the p region) can travel a comparatively large distance under the influence of diffusion processes. The minority charge carrier can then notably reach the barrier layer between the p doped channel region and the dot zone, said minority carrier then being pulled into the dot zone because of the electrical field prevailing at that area. A substantial part of the minority charge carriers of the channel region that are produced by light quanta thus accumulates in the dot zone in which their presence can be detected by means of appropriate electronic evaluation circuitry.

As opposed to conventional light-sensitive semiconductor diodes with a planar pn junction, the dot zone in the diode disclosed in EP 0 883 187 A1 does not extend over a large area in the channel region, but is rather limited to a minimum part of the surface area of the channel region. This is due to the fact that the remaining surface area over the channel region should be reserved so as to accommodate integrated electronic evaluation circuitry for reading out the charge of the semiconductor diode. Therefore, this surface area over the p doped channel region is provided with n++ doping so as to create a basis for said electronic circuitry that is electrically insulated from the channel region. The size of a pixel, that is, the surface area of a light-sensitive semiconductor component that can be selectively read out by the electronic circuitry, is limited by the diffusion length of the charge carriers in the p doped channel region in the diode disclosed in EP 0 883 187 A1. This is because only minority charge carriers that can reach a dot zone via diffusion can be detected in this dot zone. Therefore, only comparatively small pixels can be realized. Furthermore, because of the undirected nature of the diffusion, crosstalk of the signals occurs between neighboring pixels in a component as disclosed in EP 0 883 187 A1.

For many applications it is desirable to have available light-sensitive semiconductor components with pixels of comparatively large area. An example in this respect is an optical detector for reading out X-ray scintillators. The detection of X-rays usually takes place in two stages where an X-ray quantum first causes the emission of visible light in a scintillator crystal and this visible light is subsequently detected by a light-sensitive semiconductor diode in a second step. It is a typical aspect of this process that it is necessary to detect very small quantities of light that, moreover, are distributed across a large area in space because of the undirected emission. For example, the pixel of a semiconductor detector for an X-ray scintillator typically has a surface area of 2 mm$^2$ and the entire detector is then usually composed of a number of such pixels and has a format of, for example 4×100 cm$^2$ for a typical application.

It is known that light-sensitive semiconductor components with integrated amplifier circuits exhibit noise which increases as the capacitance of the semiconductor diode increases. Therefore, the reduction of the capacitance of detector elements is a crucial condition in realizing low-noise optical front ends that include a light-sensitive element and an amplifier. In this respect it is to be noted that the component is advantageously manufactured by means of customary integrating semiconductor techniques, for example, CMOS techniques, that define numerous parameters of the component for technical reasons. This holds notably for the doping strength of the channel region so that, generally speaking, it is no longer available for adaptation of the capacitance of the semiconductor diode.

Considering the foregoing it was an object of the present invention to provide a light-sensitive semiconductor element for an X-ray detector in an X-ray examination apparatus that has a comparatively large pixel surface area in conjunction with a low capacitance and hence is suitable in particular for use in X-ray scintillators. It should preferably be possible to manufacture the semiconductor component in standard (CMOS) production steps and the component should also have a high radiation hardness in respect of ionized X-rays, a suitable channel separation and an exactly defined geometry.

This object is achieved by means of a semiconductor component as disclosed in the characterizing part of claim 1. Advantageous further embodiments are disclosed in the dependent claims.

The semiconductor component thus includes a channel region with a first type of doping as well as dot zones that are in contact with the channel region and have a type of doping that opposes the doping of the channel region. The channel region may thus be p doped and the dot zones may be n doped or vice versa. Because of such different doping, a respective pn junction arises in the area of contact between the channel region and a dot zone, that is, a semiconductor diode. Furthermore, the semiconductor component includes at least one group of several dot zones, the dot zones of said group being connected electrically in parallel with one another.

Because of the electrical connection of the dot zones of a group, the charge accumulated in the dot zones can be uniformly read out. This means that the dot zones of the group together constitute a pixel. The size of this pixel is then determined by the surface area across which the group of dot zones is distributed; it can quasi be made arbitrarily large. Preferably, many of such groups, each time constituting a respective pixel, are arranged on the semiconductor component so as to cover the surface area thereof.

Preferably, the dot zones of a group are arranged so as to be coherent. This means that each dot zone of the group has at least one neighboring dot zone that is also a member of the same group. The surface area that is covered by the dot zones is typically bounded so as to be rectangular or compact in a different way.

Furthermore, the dot zones in the channel region are preferably distributed according to a hexagonal pattern. This means that each dot zone is situated at the center of a hexagon whose corners are occupied by dot zones. The smallest geometrical cell of this arrangement is an equilateral triangle with dot zones provided at its corners.

The formation of a pixel from hexagonally arranged and electrically coupled dot zones results in a detector element that has a substantially reduced capacitance and at the same time a suitable sensitivity across the entire pixel surface that is occupied by the group. As opposed to conventional detector diodes, the barrier layer (on whose surface area the capacitance of the diode is approximately proportionally dependent) does not extend across the entire pixel surface, but only across small dot-shaped areas. Nevertheless, practically all charge carriers that are produced by the incidence of light on the pixel surface area detected, because from areas of the channel region outside the barrier layer they can diffuse into the barrier layer in which they are diverted to the dot zone. Because of the hexagonal arrangement of the dot zones on the pixel surface, it can then be ensured that optimum draining of the minority charge carriers produced can take place while using an as small as possible overall surface area or number of dot zones. This means that the capacitance of the pixel is low while at the same time practically all light that is incident on the pixel surface is detected.

The electrical connection of the dot zones of a group is preferably realized in such a manner that each dot zone is connected to a collecting lead via at least two current paths. This can be realized notably by way of a plurality of electrical leads that extend in parallel and are provided on the semiconductor component in a customary manner, said leads being electrically connected to a collecting lead at the oppositely situated edges of the surface that is occupied by the group. The configuration of the leads is preferably chosen to be such that all dot zones can be electrically connected to the collecting lead while using an as small as possible quantity of metal, thus ensuring that the detector surface that is lost to the detection of light due to the masking by metal is as small as possible. The double or multiple connection of the relevant leads to a collecting lead that extends around the pixel surface offers the advantage of redundancy, so that in the event of a rupture in the lead in one location the charges of all dot zones that are connected to the lead can still be conducted to the collecting lead.

In a further embodiment of the invention the dot zones of a group (of a pixel) are surrounded by a circumferential guard ring which is formed as an opposed and preferably deeper doping in the channel region. The guard ring thus forms a line-shaped pn junction in the channel region which encloses the active surface of the pixel and thus defines the weakly doped channel regions of the individual pixels. This can be ensured notably by deep doping of the guard ring (preferably by diffusion) as well as by application of a counter voltage to the guard ring. The guard ring thus ensures that the various pixels are strictly separated from one another and that minority charge carriers that are generated in the surface of one pixel do not travel to the other pixel in which they are detected.

The dot zones in the vicinity of a guard ring are preferably arranged in a denser packing. In particular further dots can be added at a constant distance from the guard ring in order to achieve uniform sensitivity in the edge zone of the pixel. The guard ring and the additional dot zones additionally improve the frequency behavior of the detector, because the slow diffusion of photogenerated charge carriers from neighboring regions is prevented.

The surface of the channel region between the dot zones preferably is provided with a so-called threshold voltage implantation. Such a threshold voltage implantation is of the same type of doping (p or n) as the channel region on which it is formed and is generally provided in all CMOS semiconductor diodes in order to suppress the so-called "weak inversion". In the light-sensitive semiconductor element in accordance with the invention a threshold voltage implantation has the positive effect that the doping strengths that vary in the direction perpendicular to the surface of the channel region cause electric fields which support a laterally directed diffusion of charge carriers. The life of minority charge carriers generated by light is thus prolonged, thus increasing the chances of detection in a dot zone.

The channel region is preferably formed in such a manner that minority charge carriers that are generated therein by light have an as large as possible diffusion length. This length is typically in the range of from 50 to 200 $\mu$m. Large diffusion lengths increase the probability that a minority charge carrier by chance reaches the area of a barrier layer or a dot zone by diffusion so that it is detected. The diffusion length can be influenced during the formation of the channel region, for example, by way of weak doping, less implantation, fewer process steps and so on.

In order to adjust a sufficiently high yield of detected minority charge carriers from the neighboring channel region, the dot zones are preferably arranged at a distance from one another, said distance being of the order of magnitude of the diffusion length of the minority charge carriers in the channel region. This means that this distance amounts to from approximately 10 to 200% of the diffusion length.

The surface area of the preferably circular or rectangular dot zones is preferably formed with the minimum structure size that is permitted by the process used. The surface area typically amounts to from 1 to 5 $\mu m^2$, preferably approximately 2 $\mu m^2$. Such a size of the surface area on the one hand still enables adequate contacting of the dot zones by (metallic) leads while on the other hand the surface area is sufficiently small so as to ensure the desired minimized capacitance.

The dot zones of a group (pixel) are preferably arranged in such a manner that they fill an approximately rectangular region whose surface area amounts to from approximately 0.5 to 5 $mm^2$, preferably approximately 1 $mm^2$. Such large surface areas for optical semiconductor components are required notably for the pixels of X-ray detectors in order to enable as complete as possible detection of the light that is generated in a scintillator crystal. Using the present invention, despite the large surface area sufficiently small capacitances of the semiconductor diode can be ensured, so that a sensitive detector arrangement is realized that can be read out with a small amount of noise.

The CMOS technique that is an industry standard and is suitable for integration of the electronic circuitry is preferably used for the manufacture of the described semiconductor element. As a result of the hexagonal arrangement of electrically interconnected dot zones, a reduction of the capacitance of the diode detector thus formed is also possible in cases where the detector for the remainder is manufactured in conformity with standard CMOS parameters that define notably the doping strengths of channel regions.

The object is also achieved by means of an X-ray detector with a light-sensitive semiconductor component as claimed in claim 14.

Moreover, the object is also achieved by means of an X-ray examination apparatus that includes an X-ray detector and a light-sensitive semiconductor component as claimed in claim 15.

Figure 2:
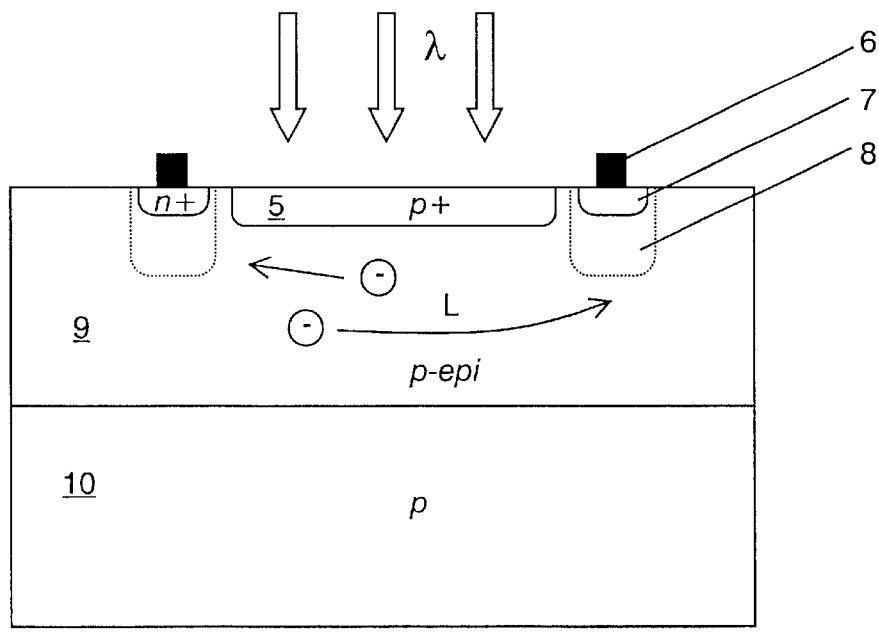

The invention will be described in detail hereinafter with reference to the Figures. Therein:

FIG. 1 is a plan view of a pixel of a light-sensitive semiconductor component in accordance with the invention, and FIG. 2 is a cross-sectional view, taken along the line II—II, of the semiconductor of FIG. 1 that covers two dot zones.

The example of the embodiment of a semiconductor component in accordance with the invention that is shown in the Figures illustrates a possibility for the manufacture of large-area photosensor elements in CMOS technology. FIG. 1 shows a pixel 1 of such a semiconductor component; a plurality of pixels of this kind may be arranged adjacent and underneath one another in order to fill a detector surface area of typically several square centimeters. The individual pixel 1 itself has an edge length of the order of magnitude of 1 mm, that is, a surface area of approximately 1 mm².

As is diagrammatically shown in FIG. 1, the pixel surface is enclosed by a p contact 2 as well as a guard ring 3. The guard ring is a line-shaped pn junction that can be formed notably by a deep n well (that is a diffused) doping in the p doped channel region 9 (FIG. 2). In addition a counter voltage may be applied to the guard ring 3 during operation so as to provide active support for the barrier function. The guard ring 3 prevents charge carriers that are generated on the pixel surface by the incidence of light from leaving the area of the pixel by diffusion, thus allowing these charge carriers to be diffused into the region of a neighboring pixel. The guard ring thus provides suppression of crosstalk (blur) and hence a strict separation of the pixels.

The active pixel surface on which incident light quanta are detected is formed essentially by the surface area within the guard ring. The pixel surface is formed by a p doped channel region 9 on which (n+) doped dot zones 7 are provided. As appears notably from FIG. 1, the dot zones 7 are distributed across the surface area in a hexagonal arrangement. This hexagonal arrangement ensures the highest possible sensitivity in the case of a given number of dot zones 7 that determines the capacitance of the element (pixel).

As can also be seen from FIG. 1, the dot zones 7 are interconnected by means of metallic leads 6 that extend at an angle of 60° relative to the pixel edges, the leads 6 being electrically interconnected in the edge zone of the pixel surface by means of a circumferential collecting lead 4. The charge carriers accumulated in the dot zones 7 can thus be drained via the collecting lead 4 so as to be evaluated in an electronic evaluation circuit (not shown). The electronic evaluation circuitry can be accommodated notably in the areas between two pixels.

The dot zones may be provided in a greater density in the edge zone of the pixel, that is, in the vicinity of the guard ring 4, in order to define and optimize the active surface area of the element. For example, five additional dot zones can be recognized at the right-hand edge of the pixel surface in FIG. 1; the placement of these dot zones deviates from the hexagonal pattern that prevails elsewhere.

FIG. 2 is a cross-sectional view, taken along the line II—II, that extends perpendicularly to the surface of the semiconductor component of FIG. 1 and covers two dot zones 7.

As appears from the cross-sectional view, the semiconductor is built up on a p doped silicon substrate 10 by means of conventional CMOS technology. On the substrate 10 there is provided a p doped epitaxial layer 9 that is referred to as a channel region in the present case. The doping of the channel region 9 is weak; for example, a doping strength of $10^{14}/cm^3$ is used. Light quanta of the wavelength λ that are incident on the semiconductor element from the outside can penetrate as far as the channel region 9 in which they generate pairs of charge carriers. Because of the manufacturing conditions, such as, for example, the weak doping of the channel region 9, the minority charge carriers (electrons $e^-$ in the present case) have a comparatively long life during which they can travel long distances by diffusion. The mean distance traveled is referred to as the diffusion length L of the minority charge carriers and typically is of the order of magnitude of 100 μm.

Dot zones 7 are provided on the surface of the channel region 9 at a distance that corresponds roughly to the order of magnitude of the diffusion length L and lies between approximately 30 and 550 μm. The dot zones 7 are formed in the channel region 9 by way of n+ doping (preferably by diffusion), the doping strength typically amounting to $10^{16}/cm^3$. The barrier layer or depletion zone 8 of a semiconductor diode is formed in known manner between the (n+) doped dot zone 7 and the p doped channel region 9, the size of said zone being increased by connection in the reverse direction. On the dot zones 7 there are provided the metallic lead contacts 6 that electrically interconnect all dot zones in the manner shown in FIG. 1.

When the minority charge carriers that are generated in the channel region 9 by the incidence of light reach the depletion zone 8 by diffusion, they are seized by the electrical field prevailing therein and are conducted to the dot zone 7. Via the contacts 6, they can then be conducted to an appropriate electronic evaluation circuit so as to serve as proof of the detected light. Even though the dot zones 7 occupy only a very small area of typically 2 μm², as a result of the diffusion process they collect charge carriers from a laterally expansive part of the channel region 9. This means that the capacitance of the semiconductor element, being determined by the overall surface area of the dot zones 7 of the pixel 1, can remain small and that light can be detected from the entire pixel surface nevertheless.

The hexagonal arrangement of the dot zones 7 ensures that the minority charge carriers reach a dot zone 7, or the associated barrier layer 8, after a minimum diffusion distance, so that a suitable compromise is reached between the distance between the dot zones 7 and the sensitivity of the element. Furthermore, the distance between the dot zones 7 defines the bandwidth of the sensor. The use of the hexagonal structure in this case enables the bandwidth to be increased in comparison with all other arrangements that are feasible.

Because the collecting of charge and the movement of charge in the channel region 9 is of a diffusive nature, crosstalk would occur between neighboring pixels in a dense packing if no steps were taken. Such crosstalk would be caused by charge carriers that are generated in a first channel region but are diffused to the channel region of a neighboring pixel. Such diffusion, however, in the present case is prevented by the guard ring 3.

It can also be seen in FIG. 2 that a (p+) doped layer 5 is provided on the surface of the channel region 9 between the dot zones 7. This layer 5 is a (flat) threshold voltage implantation that is customarily formed in the CMOS technique in order to suppress the weak inversion for the isolation of the dot zones 7 on the Si—SiO interface. As a result of the different doping strengths in the threshold voltage implantation 5 and in the channel region 9, electrical fields are produced that have an advantage effect on the movement of the minority charge carriers. This means that these charge carriers are driven preferably laterally towards the dot zones 7 by these fields.

What is claimed is:

1. A light-sensitive semiconductor component comprising:
   a channel region with a first type of doping; and
   dot zones with an opposed type of doping that are in contact with said channel region, a pn junction being formed at the area of contact between said channel region and each of said dot zones, wherein at least one group of said dot zones is electrically connected in parallel with another dot zone or group of dot zones to a collecting lead proximate oppositely situated edges of a pixel occupied by said dot zones.

2. The semiconductor component as claimed in claim 1, wherein said dot zones of the at least one group of zones are arranged so as to be coherent.

3. The semiconductor component as claimed in claim 1, wherein said dot zones are arranged in a hexagonal distribution on the channel region.

4. The semiconductor component as claimed in claim 1, further wherein each of said dot zones are connected to the collecting lead via at least two current paths.

5. The semiconductor component as claimed in claim 1, further comprising:
   a circumferential guard ring formed as an opposed and preferably deep doping in the channel region, wherein said guard ring circumferentially encloses said dot zones.

6. A light-sensitive semiconductor component comprising:
   a channel region with a first type of doping; and
   dot zones with an opposed type of doping that are in contact therewith, a pn junction being formed at the area of contact between the channel region and each of the dot zones, and at least one group of dot zones that are connected electrically in parallel with one another being provided, wherein the dot zones of a group are enclosed by a circumferential guard ring that is formed as an opposed and preferably deep doping in the channel region, wherein the dot zones are arranged in a denser packing in the vicinity of the guard ring.

7. A light-sensitive semiconductor component comprising:
   a channel region with a first type of doping; and
   dot zones with an opposed type of doping that are in contact therewith, a pn junction being formed at the area of contact between the channel region and each of the dot zones, and at least one group of dot zones that are connected electrically in parallel with one another, wherein the surface of the channel region includes a threshold voltage implantation region disposed in the surface of the channel region between the dot zones.

8. The semiconductor component as claimed in claim 1, wherein said channel region is p doped and said dot zones are n doped or vice versa.

9. A The semiconductor component as claimed in claim 1, wherein said channel region provides a minority charge carrier diffusion length (L) on the order of from 50 to 200 $\mu$m.

10. The semiconductor component as claimed in claim 1, wherein neighboring dot zones of said dot zones are spaced apart from each other a distance on the order of from 10 to 200% of the diffusion length (L) of minority charge carriers in said channel region.

11. The semiconductor component as claimed in claim 1, wherein said dot zones further include a surface area with a minimum structure size on the order of from approximately 1 to 5 $\mu$m.

12. The semiconductor component as claimed in claim 1, further wherein said dot zones fill a rectangular region having a surface area on the order of from 0.5 to 5 mm$^2$.

13. The semiconductor component as claimed in claim 1, wherein said component is manufactured via CMOS technology.

14. An X-ray detector which includes a light-sensitive semiconductor component comprising:
   a channel region with a first type of doping; and
   dot zones with an opposed type of doping that are in contact with said channel region, a pn junction being formed at the area of contact between said channel region and each of said dot zones, and wherein at least one group of dot zones is electrically connected in parallel with another dot zone or group of dot zones to a collecting lead proximate oppositely situated edges of a pixel occupied by said dot zones.

15. An X-ray examination apparatus that includes an X-ray detector with a light-sensitive semiconductor component, comprising:
   a channel region with a first type of doping; and
   dot zones with an opposed type of doping that are in contact with said channel region, a pn junction being formed at the area of contact between said channel region and each of said dot zones, and wherein at least one group of said dot zones is electrically connected in parallel with another dot zone or group of dot zones to a collecting lead proximate oppositely situated edges of a pixel occupied by said dot zones.

16. The semiconductor component as claimed in claim 5, wherein said dot zones are arranged in a denser packing in the vicinity of said guard ring.

17. The semiconductor component as claimed in claim 1, wherein said channel region includes a threshold voltage implantation region disposed in the surface of said channel region between two of said dot zones.

* * * * *